(12) United States Patent
O'Gorman et al.

(10) Patent No.: US 7,075,273 B2
(45) Date of Patent: Jul. 11, 2006

(54) AUTOMOTIVE ELECTRICAL SYSTEM CONFIGURATION USING A TWO BUS STRUCTURE

(75) Inventors: Patrick A. O'Gorman, Grayslake, IL (US); Donald J. Remboski, Dearborn, MI (US); Dennis L. Stephens, Barrington, IL (US)

(73) Assignee: Motorola, Inc., Schaumburg, IL (US)

( * ) Notice: Subject to any disclaimer, the term of this patent is extended or adjusted under 35 U.S.C. 154(b) by 120 days.

(21) Appl. No.: 10/925,558

(22) Filed: Aug. 24, 2004

(65) Prior Publication Data
US 2006/0043938 A1 Mar. 2, 2006

(51) Int. Cl.
*H02J 7/14* (2006.01)
*H02P 9/44* (2006.01)

(52) U.S. Cl. ............... 322/28; 322/7; 322/99; 290/40 C

(58) Field of Classification Search ............ 322/7, 322/26, 27, 28, 99; 290/40, 40 C, 40 F
See application file for complete search history.

(56) References Cited

U.S. PATENT DOCUMENTS

| | | | | |
|---|---|---|---|---|
| 4,623,833 A | * | 11/1986 | Edwards | 322/28 |
| 4,733,159 A | * | 3/1988 | Edwards et al. | 323/282 |
| 5,502,368 A | * | 3/1996 | Syverson et al. | 322/28 |
| 5,543,703 A | * | 8/1996 | Kusase et al. | 322/16 |
| 5,631,544 A | | 5/1997 | Syverson et al. | |
| 5,675,237 A | * | 10/1997 | Iwatani | 322/28 |
| 5,753,989 A | * | 5/1998 | Syverson et al. | 310/114 |
| 5,914,542 A | | 6/1999 | Weimer et al. | |
| 5,973,482 A | | 10/1999 | Meinert | |
| 6,118,186 A | * | 9/2000 | Scott et al. | 290/40 B |
| 6,787,933 B1 | * | 9/2004 | Claude et al. | 290/52 |
| 6,812,586 B1 | * | 11/2004 | Wacknov et al. | 290/52 |
| 2002/0053560 A1 | | 5/2002 | Bunker et al. | |
| 2002/0139593 A1 | | 10/2002 | Charaudeau et al. | |
| 2003/0075997 A1 | | 4/2003 | Keim et al. | |

FOREIGN PATENT DOCUMENTS

EP 0533037 4/1996

OTHER PUBLICATIONS

Karl J. Astrom, Bjorn Wittenmark, Computer-Controlled Systems Theory and Design Second Edition, book, 1990, 27 pages, Prentice Hall, Englewood Cliffs, New Jersey 07632.

(Continued)

*Primary Examiner*—Nicholas Ponomarenko
(74) *Attorney, Agent, or Firm*—Thomas V. Miller

(57) ABSTRACT

Disclosed herein are a variety of different electrical system topologies intended to mitigate the impact of large intermittent loads on a 12 volt vehicle power distribution system. In some embodiments the intermittent load is disconnected from the remainder of the system and the voltage supplied to this load is allowed to fluctuate. In other embodiments, the voltage to critical loads is regulated independently of the voltage supplied to the remainder of the system. The different topologies described can be grouped into three categories, each corresponding to a different solution technique. One approach is to regulate the voltage to the critical loads. A second approach is to isolate the intermittent load that causes the drop in system voltage. The third approach is to use a different type of alternator that has a faster response than the conventional Lundell wound field machine.

35 Claims, 7 Drawing Sheets

OTHER PUBLICATIONS

A.E. Fitzgerald, Charles Kingsley, Jr., Stephen D. Umans, Electric Machinery—Fourth Edition Book, 1983, 105 pages, McGraw-Hill Book Company, United States of America.

Bosch, Automotive Electrics and Electronics Third Edition, book, 1999, 312 pages, Robert Bosch GmbH, Stuttgart, Germany.

Bosch, Automotive Electrics and Electronics Second Edition, book, 1995, 376 pages, Robert Bosch GmbH, Stuttgart, Germany.

T.J.E. Miller, Brushless Permanent-Magnet and Reluctance Motor Drives, book, 1989, 165 pages, Oxford University Press, Oxford, New York.

Isidor Buchmann, Charging the Lead-Acid Battery, on-line article, Apr. 2003, 4 pages, www.batteryuniversity.com.

Ridley Engineering, Inc., An Accurate and Practical Small-Signal Model for Current-Mode Control, journal, 1999, 21 pages, Ridley Engineering, Inc., United States.

\* cited by examiner

AUTOMOTIVE ELECTRICAL SYSTEM CONFIGURATION USING A TWO BUS STRUCTURE

FIELD OF THE INVENTION

This invention in general relates to automotive electrical systems and, more particularly, to configurations of automotive electrical power systems adapted for use with high power loads.

BACKGROUND OF THE INVENTION

The 12 volt systems used in today's automobiles are required to supply ever increasing currents as the load on the system continues to increase. This increase is due to a combination of increasing numbers of electronic devices, such as communication, entertainment, and telematics systems, as well as the proliferation of electric powered auxiliary systems to replace traditional hydraulic or mechanical powered systems. To reduce the amount of current required to supply these higher loads, it has been proposed that automobiles should adopt 42 volt electrical systems. However, the automotive industry has been reluctant to transition to 42 volt electrical systems because of increased costs. Consequently, there is a strong demand to improve the performance of 12 volt systems, thereby allowing higher electrical loads to operate effectively with conventional vehicle electrical systems.

As an example, high current loads, such as electric power steering (EPS), cannot practically be used in larger vehicles, such as light trucks, with conventional vehicle electric systems. EPS in particular places a large demand on the electrical system because it draws a large current at low vehicle speeds, which is where the most steering assist is required. However, at low vehicle speeds, e.g. in a parking lot, the engine is typically at or near idle and thus alternator current output capability is severely limited. As a result, the vehicle electrical system cannot supply the power needed by EPS without the 12 volt bus experiencing a temporary voltage dip. When this voltage dip occurs, a variety of objectionable performance is experienced from various electrical systems, for example dimming of the vehicle lights. Additionally, it is also likely that the required EPS current cannot be supplied, and thus the desired steering response will not occur.

A variety of solutions to the problem of supplying high current loads in vehicle electrical system have been proposed. European patent application EP0533037A1, entitled "An Electrical System for a Motor Vehicle, Including at Least One Supercap" describes a circuit and supercapacitor arrangement that is connected across a load. The load is energized initially from the supercapacitor. The amount of energy drawn from the supercapacitor is not optimized because the supercapacitor is connected directly across the load, thereby limiting the voltage drop across the supercapacitor. Also, there is no isolation of the load/supercapacitor circuit from the battery other than a simple diode, so the temporary power provided to the load is not entirely decoupled from the battery.

U.S. Pat. No. 5,914,542, entitled "Supercapacitor Charging" describes a DC power distribution system for a fighter aircraft. In the described system, the battery is located remotely from the load. A supercapacitor is connected to the DC bus through a supercapacitor boost converter combination close to the load. The supercapacitor is normally disconnected from the bus, but when a load transient occurs, the battery is disconnected from the load and the load is supplied from the supercapacitor. This system is disadvantageous in that the energy supplied to the load is limited solely to that in the supercapacitor.

The present invention attempts to minimize the above-mentioned drawbacks and proposes a system that solves or at least minimizes the problems of the prior art.

Figure 1:
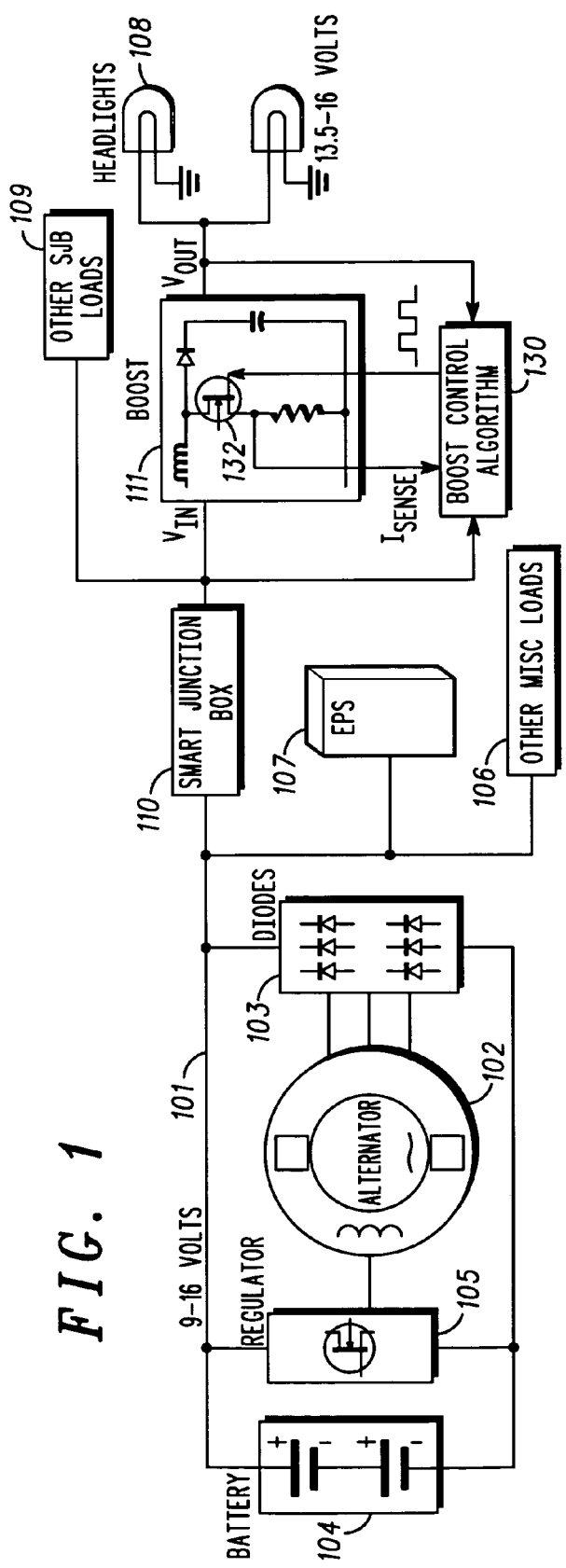
FIG. 1 illustrates an automotive electrical system in which a critical load is powered by a boost converter to minimize the effects of voltage dip on the main bus caused by a high current transient from another load.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described are electrical system topologies intended to mitigate the impact of large intermittent loads on a 12 volt vehicle power distribution system. In some embodiments, the intermittent load is disconnected from the remainder of the system and the voltage supplied to this load is allowed to fluctuate. In other embodiments, the voltage to critical loads (e.g., the headlights) is regulated independently of the voltage supplied to the remainder of the system. The different topologies described can be grouped into categories, each corresponding to a different solution technique.

One approach is to regulate the voltage to the critical loads. A solution in this mode is to provide a separate boost converter for critical loads, as illustrated in FIG. 1. A second approach is to isolate the intermittent load (e.g., EPS) that causes the drop in system voltage. These solutions typically involve multi-directional DC/DC converters and are illustrated in FIGS. 3–7. The third approach is to use a different type of alternator that has a faster response than the conventional Lundell wound field machine. This approach is illustrated in FIG. 8.

Now, turning to the drawings, FIG. 1 illustrates an automotive electrical power system according to certain teachings of the present invention. In FIG. 1, the voltage to the critical loads, e.g., headlights 108, is regulated using a separate converter (i.e., boost converter 111) while the remainder of the 12 volt system suffers from voltage dips because the alternator does not respond fast enough.

Vehicle main power bus 101 is supplied with a voltage in the range of 9 to 16 volts DC. This energy is supplied from alternator 102, which, in this embodiment is a typical wound field alternator as is known to those skilled in the art. Current flows from alternator 102 to bus 101 through rectifier bank 103. The rectifier bank 103 may comprise one or more diodes, as is typical, or may comprise controlled switched rectifiers such as transistors, e.g., field effect transistors (FETs), or silicon controlled rectifiers (SCRs). Additionally, both alternator 102 and rectifier bank 103 may be of single phase or multi-phase form.

Storage battery 104 is also connected to bus 101. In many automotive applications, this battery is a conventional lead acid battery, although various other battery types may also be used. During normal vehicle operation, battery 104 does not supply steady state energy to bus 101 and the loads connected thereto. The electrical energy required for normal vehicle operation is provided by alternator 102, assuming that the capacity of the alternator is sufficient to provide the required power. If this power cannot be supplied by the alternator, power is drawn from the battery. In addition, battery 104 is available to provide power to the various electrical loads when the vehicle is not in operation.

During normal vehicle operation, battery 104 is charged from bus 101. Battery charging current may be left uncontrolled, as is typical, or voltage regulator 105 may be configured to regulate the charge current and voltage supplied to the battery. However, in normal operation, voltage regulator 105 is operative to keep the voltage of the bus 101 at a nearly constant value. This is necessary because the output voltage of alternator 102 varies with engine speed and the electrical load connected to the bus 101. Design of various voltage regulator circuits is well known to those skilled in the art, and thus is not addressed in detail here.

A variety of electrical loads are supplied with power by bus 101. These include miscellaneous loads 106, which are typical electrically powered devices in automobiles, such as radios, interior lighting, HVAC blowers, etc. An additional load in the illustrated example is an electric power steering (EPS) system 107, which, as discussed above is a high power/high current load. Still further electrical loads, in this case critical loads such as headlights 108 and other critical loads 109 are also connected to bus 101, albeit indirectly by smart junction box 110 and boost converter 111.

Smart junction box 110 has a microcontroller that controls the turn on and off of the lights using a high side switch. This is distinguished from a conventional junction box, which has no ability to control the loads receiving power therefrom. Having a smart junction box capable of load control is advantageous because the current inrush into the lights when first turned on can be controlled, thereby extending the lifetime of the lights. Most of the control of auxiliary loads (excluding high current loads such as the starter and EPS) is consolidated into smart junction box 110 rather than split into two or three different load control boxes.

In the embodiment of FIG. 1, the critical loads are supplied through boost converter 111 which regulates the voltage to this load. When one of the loads connected directly to bus 101 draws a large amount of current, causing a voltage dip on bus 101, the boost converter 111 boosts the voltage supplied to critical load 108 to maintain a relatively constant voltage in the 13.5–16 volt range to the critical loads such as the headlights. This prevents undesirable side effects of the high current loads, such as dimming of the headlights. Additionally, this topology is advantageous in that it requires relatively minor changes to existing vehicle electrical systems. Other than the addition of smart junction box 110 and boost converter 111, the remainder of the electrical system remains unchanged. Additionally, some current production vehicles already include a smart junction box, so only boost converter 111 need be added.

In one embodiment, the boost converter 111 may operate in a current mode control loop, as explained in "An Accurate and Practical Small Signal Model for Current Mode Control", from Ridley Engineering Inc (www.ridleyengineering.com). A boost control algorithm 130 can be used to control a switch 132 in the boost converter 111. A sense resistor may be used to read the current ($I_{sense}$) through the switch 132 and to determine when the switch turns off. Additionally, other methods of sensing current may include reading the inductor current directly. Note that when the switch is turned on, the switch current and inductor current are the same.

Figure 2:
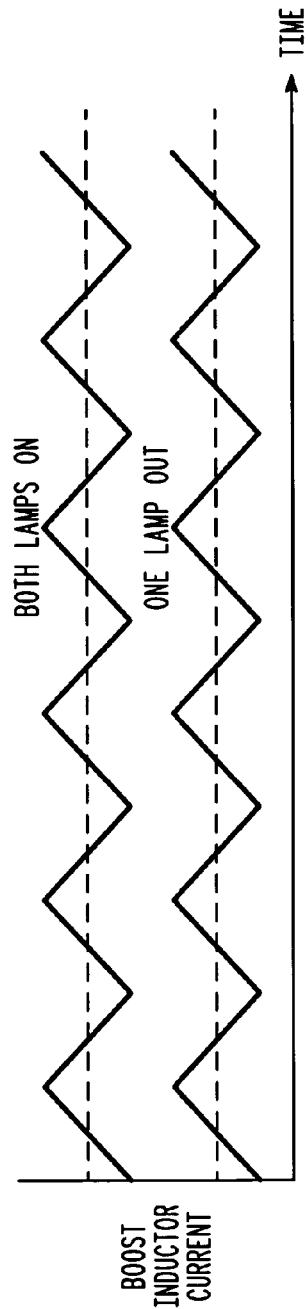
FIG. 2 illustrates a plot of inductor current for headlights.

FIG. 2 shows a plot of inductor current versus time for two cases: one where both lamps (of the headlights) are operating properly and another case where one of the lamps is open and no current flow through this lamp. Consequently, as shown in FIG. 2, the average current through the inductor drops down, approximately 50% of the two-lamp case. The malfunction condition is determined by comparing operation of the circuit when both lamps are operating to that when only one lamp operates. The peak inductor current is directly related to the average inductor current and is used in this case to determine if a lamp is open. When the switch is turned off, the peak current is sampled and is compared to the expected current for the two-lamp case (both lamps on). If it is approximately 50% of its expected value, an open lamp condition is indicated. Clearly, if the current is almost zero, both lamps are open and a fault condition is also indicated.

In some cases, each lamp may be powered by separate boost circuits, instead of one combined boost circuit. In this case, an open lamp is determined by comparing the peak current in each boost circuit. It is expected that the currents in each boost circuit will be approximately the same and will not be close to zero amps, in which case both lamps are open circuit.

The boost circuit 111 may be disabled in certain cases where boost operation is not desired even though the boost output voltage ($V_{out}$) is less than the desired value. One of these cases is where daytime running lights are energized. It is desirable to reduce the voltage to the headlights when in a daytime running mode to prolong the bulb lifetime. In this case, the circuit of the boost converter 111 is disabled and the voltage to the headlights 108 is less than the battery voltage as a result of smart junction box 110 operation. Another case where the boost is disabled is when the lights are first turned on and the inrush current to the lamps is controlled by the smart junction box 110. A current inrush occurs because the lamp resistance is low when first turned on and increases to its final resistance only after the lamp in the headlights 108 heats up—100 ms is a typical time. In this case, the circuit of the boost converter 111 is temporarily disabled by the smart junction box 110 until the inrush current has reached its final value. At this time, the boost converter 111 is enabled and the output voltage is boosted, if needed.

Figure 3:
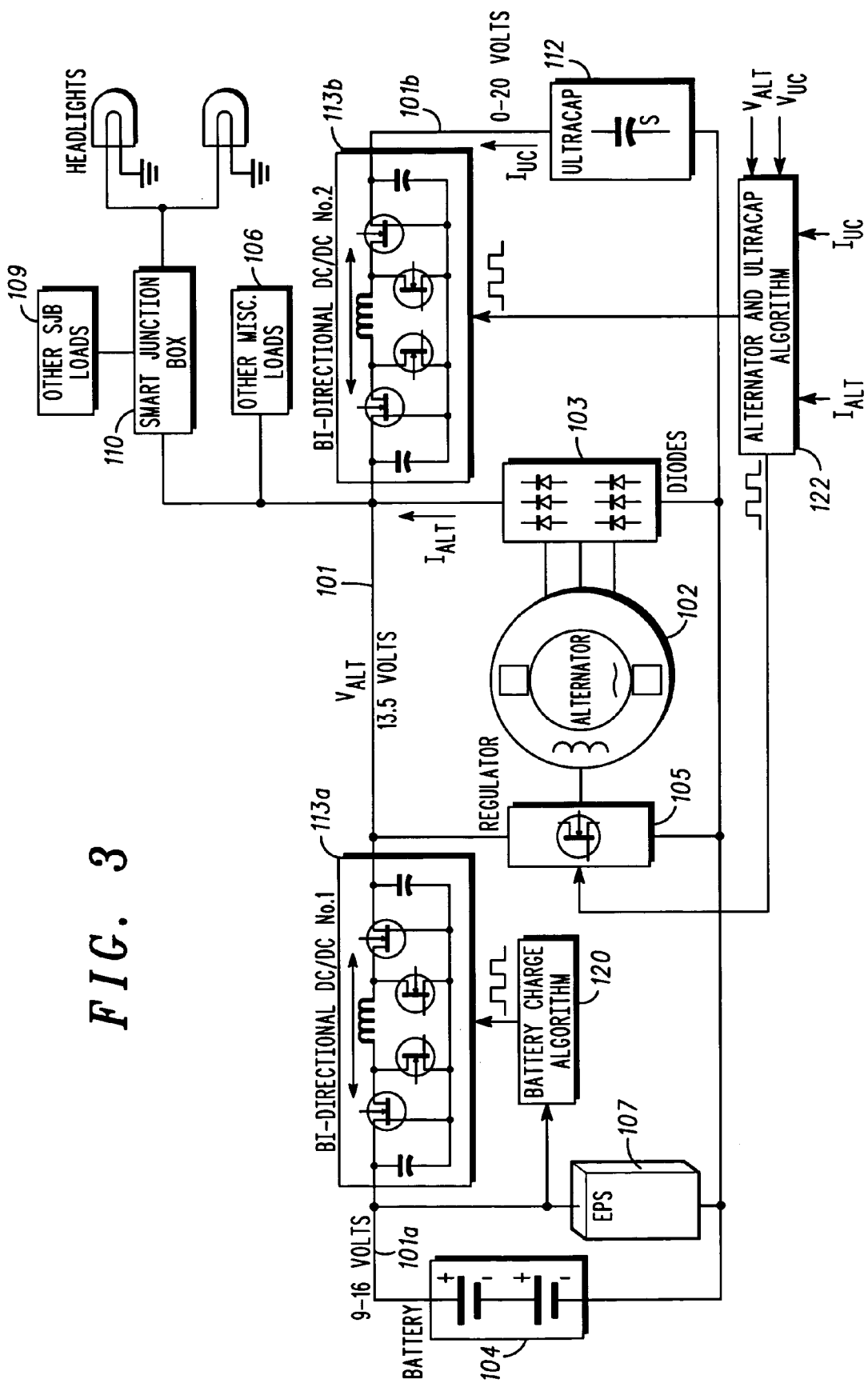
FIG. 3 illustrates an automotive electrical system in which a high current load is isolated from the main electrical bus by a bidirectional DC-DC converter and in which a supercapacitor is provided to supply high current transients through a second bidirectional DC-DC converter.

Another embodiment is disclosed in FIG. 3. In this topology, EPS 107 and battery 104 are isolated from the remainder of the system, to prevent voltage dips caused by high current transients of EPS 107 from affecting the rest of the system. As in the embodiment of FIG. 1, electrical energy is supplied by an engine driven alternator 102, which is a typical wound field machine. The AC voltage produced by the alternator is rectified by rectifier bank 103 thus supplying a DC voltage of about 13.5 volts to main bus 101. Voltage regulator 105 serves to maintain the voltage of main bus 101 at a relatively constant value. A variety of miscellaneous loads 106 are connected directly to main bus 101, as are critical loads such as the headlights 108 and other critical loads 109, both of which are connected to the main bus 101 by smart junction box 110.

In the embodiment of FIG. 3, the high current load, e.g., EPS 107, is connected directly to the battery 104 by secondary bus 101a. Secondary bus 101a and the devices connected thereto are isolated from the remainder of the system by a bidirectional DC-DC converter 113a. As with the boost converter 111 of FIG. 1, the bidirectional DC-DC converters 113a and 113b may take a variety of forms known to those skilled in the art. Typically these converters will be from the category of bidirectional buck-boost converters, of which the illustrated example is one of the most simple and typical types. The function of bidirectional DC-DC converter 113a is to control the flow of current between bus 101 and secondary bus 101a. This can be done by using a battery charge algorithm 120, explained further below. Depending on the voltage levels of buses 101 and 101a, the converter 113a will function as either a boost converter or a buck converter as required.

During normal operation, the DC-DC converter 113a connects the battery 104 and EPS 107 to the rest of the electrical system. This allows battery 104 to be charged and provides normal operating currents to EPS 107. When a large EPS transient occurs, the current for the remainder of the system is supplied by alternator 102 and supercapacitor 112, which delivers electrical energy to main bus 101 through bidirectional DC-DC converter 113b. Supercapacitor 112 is essentially a relatively high capacitance capacitor based on a hybrid of capacitor and battery technology supercapacitors. Supercapacitors, also known as ultracapacitors, are generally known to those skilled in the art, and therefore details of these devices are not repeated here.

In one embodiment, a controller for the bidirectional DC-DC converter 113a executes a battery charge algorithm 120, as described in "Charging the Lead Acid Battery" by Isidor Buchman (www.batteryuniversity.com). This algorithm charges the battery 104 at constant current when deeply discharged and charges at constant voltage otherwise. In most automotive applications, a constant charging voltage is applied to the battery 104, for instance 14.5V and it depends on the ambient temperature.

A second bidirectional DC-DC converter 113b works in conjunction with voltage regulator 105 to stabilize the voltage of main bus 101 at 13.5 volts, as explained further below. Additionally, the first bidirectional DC-DC converter 113a provides a degree of isolation between high current load EPS 107 and the rest of the electrical system, which further contributes to the voltage stability of main bus 101. As a result, the boost converter 111 that supplied the power to the critical loads in the embodiment of FIG. 1 is not required. The configuration of FIG. 3 is advantageous where the large currents are needed by the intermittent loads and loads other than lights, e.g., loads 109 and 106, need a regulated voltage supply. As the second bidirectional DC-DC converter 113b and the alternator 102 respond to the increased need for current, the first bidirectional DC-DC converter 113a can redirect available energy to the secondary bus 101a, thereby reducing the impact on the battery voltage. Once the alternator 102 is capable of supplying all of the power needed for bus 101 and secondary bus 101a, the first bidirectional DC-DC converter 113a acts as a pass-through and buck or boost operation is not utilized. The loads 106 and 110 are shown connected to the alternator 102 but they may also be connected to the supercapacitor 112. It might also be advantageous to separate the different loads 106 and 110 so they do not connect to the same side of the converter 113b.

In one embodiment, a controller for the second bidirectional DC-DC converter 113b executes an alternator and supercapacitor algorithm 122 to maintain the bus 101 at a constant voltage as the primary constraint, for instance 13.5V. This is achieved through a combination of the alternator output current ($I_{alt}$) and the current drawn from or supplied to the supercapacitor 112 ($I_{uc}$). As an additional constraint, the supercapacitor voltage ($V_{uc}$) is maintained at a fixed voltage, for instance 20V, by managing the current supplied to the supercapacitor 112 when bus 101 voltage exceeds the set value. In one embodiment, using the alternator current ($I_{alt}$), alternator voltage ($V_{alt}$), supercapacitor current ($I_{uc}$), and supercapacitor voltage ($V_{uc}$), the following pseudo-code may be used to achieve both of these constraints:

```
If (V_alt >= 13.5V)
    If (I_uc >= 0)
        force I_uc less positive
    else
        If ((V_uc < 20V) AND (I_uc < I_uc_max))
            force I_uc more negative
        else
            force I_uc less negative
            force I_alt less positive using PI controller (note 1)
        endif /* V_uc, I_uc */
    endif /* I_uc */
elseif (V_alt < 13.5V)
    If (I_uc >= 0)
        force I_uc more positive positive
        force I_alt more positive positive using PI controller and I_uc
component (note 2)
    else
        force I_uc less negative
        force I_alt more positive positive using PI controller
    endif /* I_uc */
endif /* 13.5V */
```

Note 1: A proportional-integral (PI) controller may be used to regulate a field voltage ($V_f$) as a means to force the voltage of the alternator ($V_{alt}$) to its desired value (13.5V in this example). This can be done by comparing alternator voltage ($V_{alt}$) to 13.5V and setting the value of the field voltage ($V_f$). In one embodiment, relation (1) may be used:

$$V_f = K_P \cdot (13.5 - V_{alt}) + K_I \int (13.5 - V_{alt}) \quad (1)$$

where $V_f$ is the field voltage, $K_P$ and $K_I$ are the proportional and integral gains of a well-known PI (proportional-integral) controller, and $V_{alt}$ is the alternator voltage.

Note 2: In this case, the PI controller is augmented by a component which depends on the current of the supercapacitor ($I_{uc}$) using relation (2):

$$V_f = K_P \cdot (13.5 - V_{alt}) + K_I \int (13.5 - V_{alt}) + K_{uc} \cdot I_{uc} \quad (2)$$

where $V_f$ is the field voltage, $K_P$ and $K_I$ and $K_{uc}$ are the proportional and integral gains of a well-known PI (proportional-integral) controller, and $I_{uc}$ is the current of the supercapacitor 112.

A typical method to force the current of the supercapacitor ($I_{uc}$) to its desired value is to use relation (3):

$$V_{control} = K_{uc} \cdot I_{uc} \quad (3)$$

In this case, $V_{control}$ is used to set the duty cycle on the switches in the second bidirectional DC-DC converter 113b.

Figure 4:
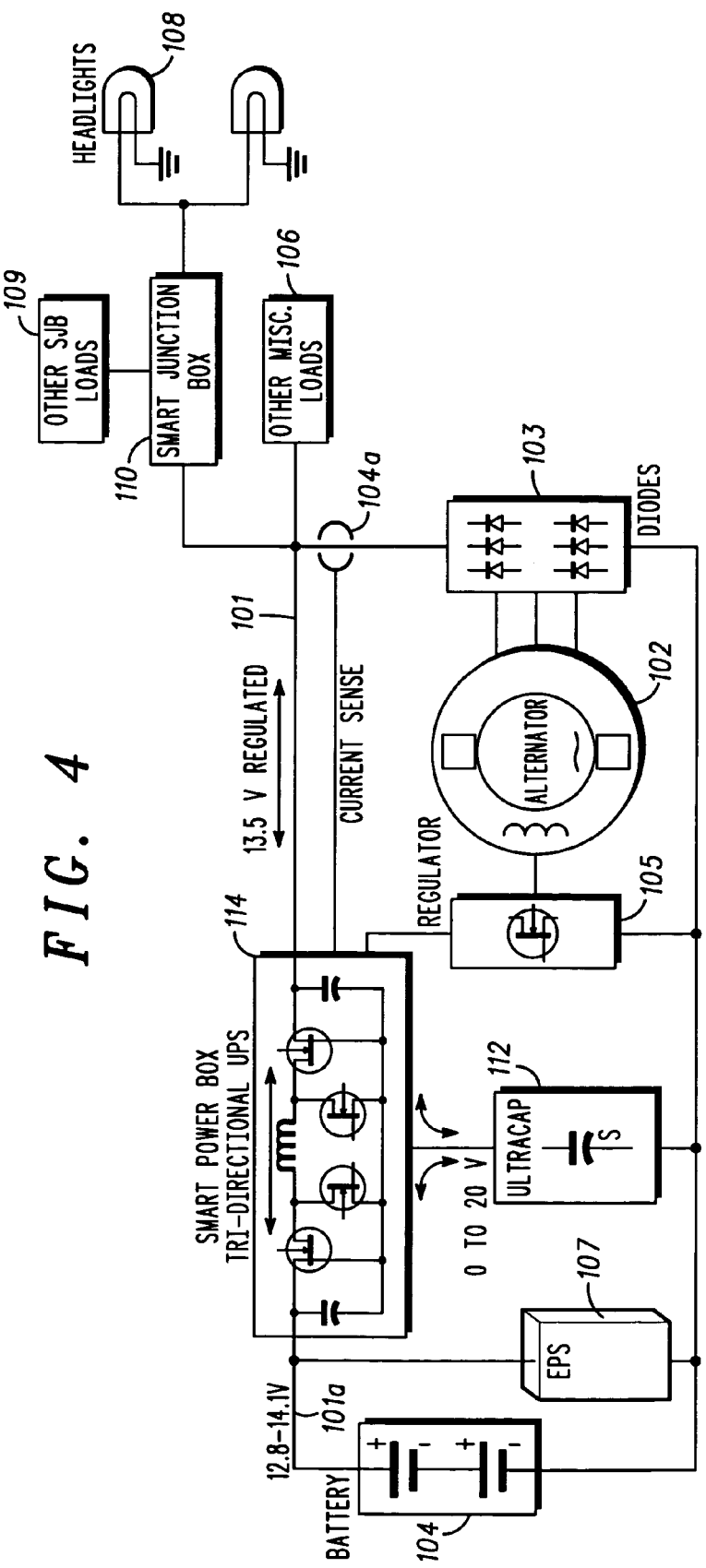
FIG. 4 illustrates a variation of the circuit of FIG. 3 in which the two DC-DC converters are replaced with a single tri-directional DC-DC converter.

FIG. 4 illustrates a variation of the embodiment of FIG. 3. As in the embodiment of FIG. 3, EPS 107 and battery 104 are isolated from the remainder of the system. The two bidirectional DC-DC converters 113a and 113b of FIG. 3 have been replaced with one tri-directional converter 114. Tri-directional converter 114 is basically a combination of converters 113a and 113b. The power flow into and out of each of the three terminals is managed depending on the voltage of each terminal and the priority of each bus. A terminal which has highest priority will have its voltage maintained at the regulated point at all times to the detriment of the other terminal voltages. In operation, the tri-directional converter 114 is capable of transferring energy to or from any combination of main bus 101, secondary bus 101a, and supercapacitor 112.

One difference between the embodiment of FIG. 4 and the embodiment of FIG. 3 is that voltage regulator 105 is connected to tri-directional converter 114, and the voltage set point of the regulator is not fixed to 13.2 volts output. In the embodiment of FIG. 4, the regulator is an integral part of the electrical system and operates under the control of tri-directional converter 114. Properly designed, the topology illustrated in FIG. 4 will have improved system response over the topology of FIG. 3 because the system operation is centrally controlled. Enhanced system response could also be obtained by implementing current sensor 114a, which allows the control circuit of tri-directional converter 114 to respond to the output current of alternator 102. Additionally, one could also implement the basic topology of FIG. 3 while replacing bidirectional converters 113a and 113b with tri-directional converter 114 of FIG. 4.

Figure 5:
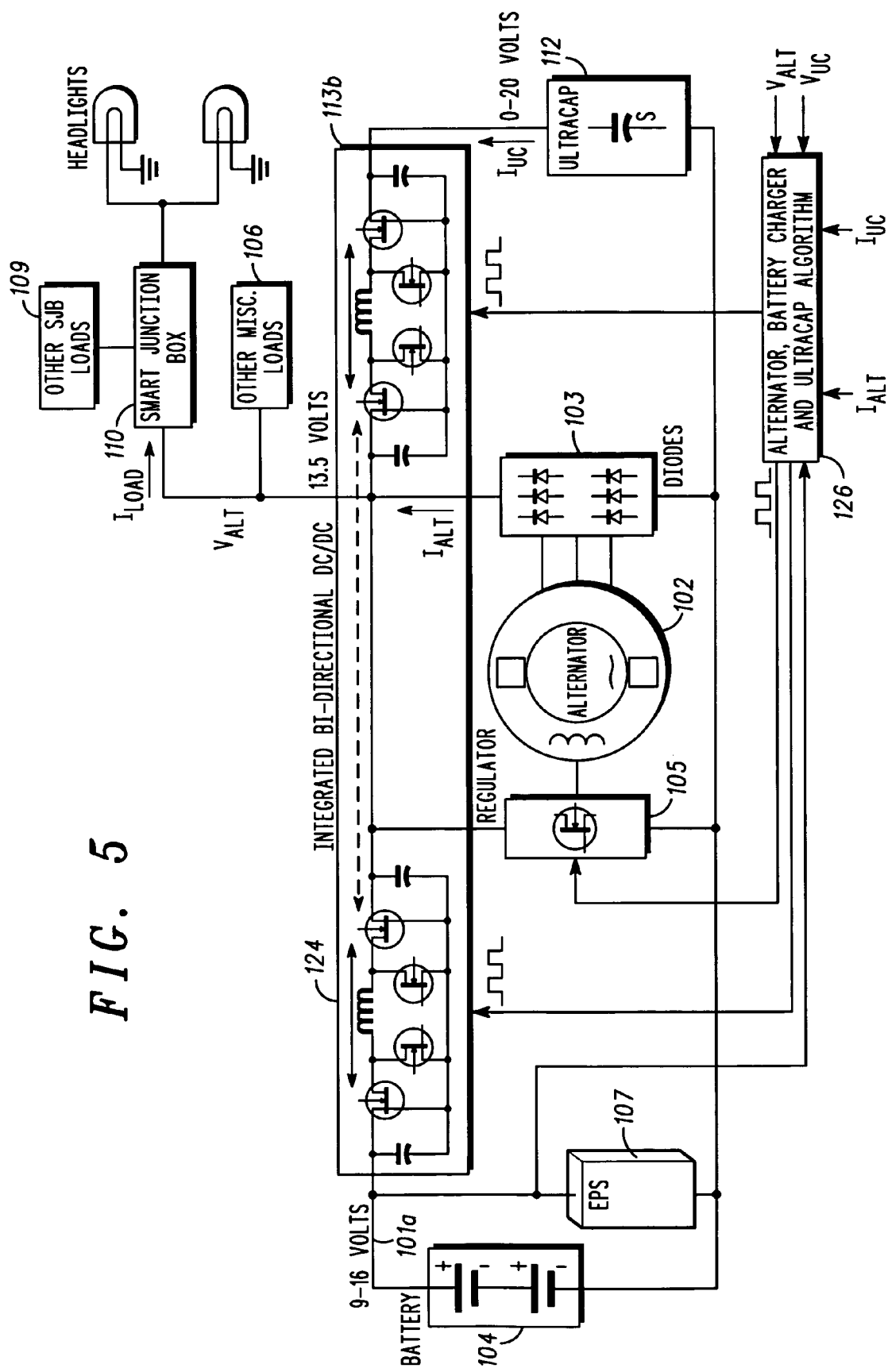
FIG. 5 illustrates another embodiment where two bidirectional DC-DC converters are integrated into a single package.

FIG. 5 illustrates another embodiment where the bidirectional converters 113a and 113b are integrated into the same package. Here, the topology includes an integrated bidirectional converter 124 and positioned to allow the EPS 107 and the battery 104 to be isolated from the remainder of the system. A controller for the integrated bidirectional converter 124 executes an algorithm 126. In this case, each portion of the integrated bidirectional converter 124 is controlled by the same algorithms 120 and 122 discussed above in relation to FIG. 3. Accordingly, the algorithm 126 includes a battery charge algorithm 120 component and an alternator and supercapacitor algorithm 122 component detailed above. The operation of the integrated bidirectional converter 124 is capable of transferring energy to and from the main bus 101 and the supercapacitor 112.

Figure 6:
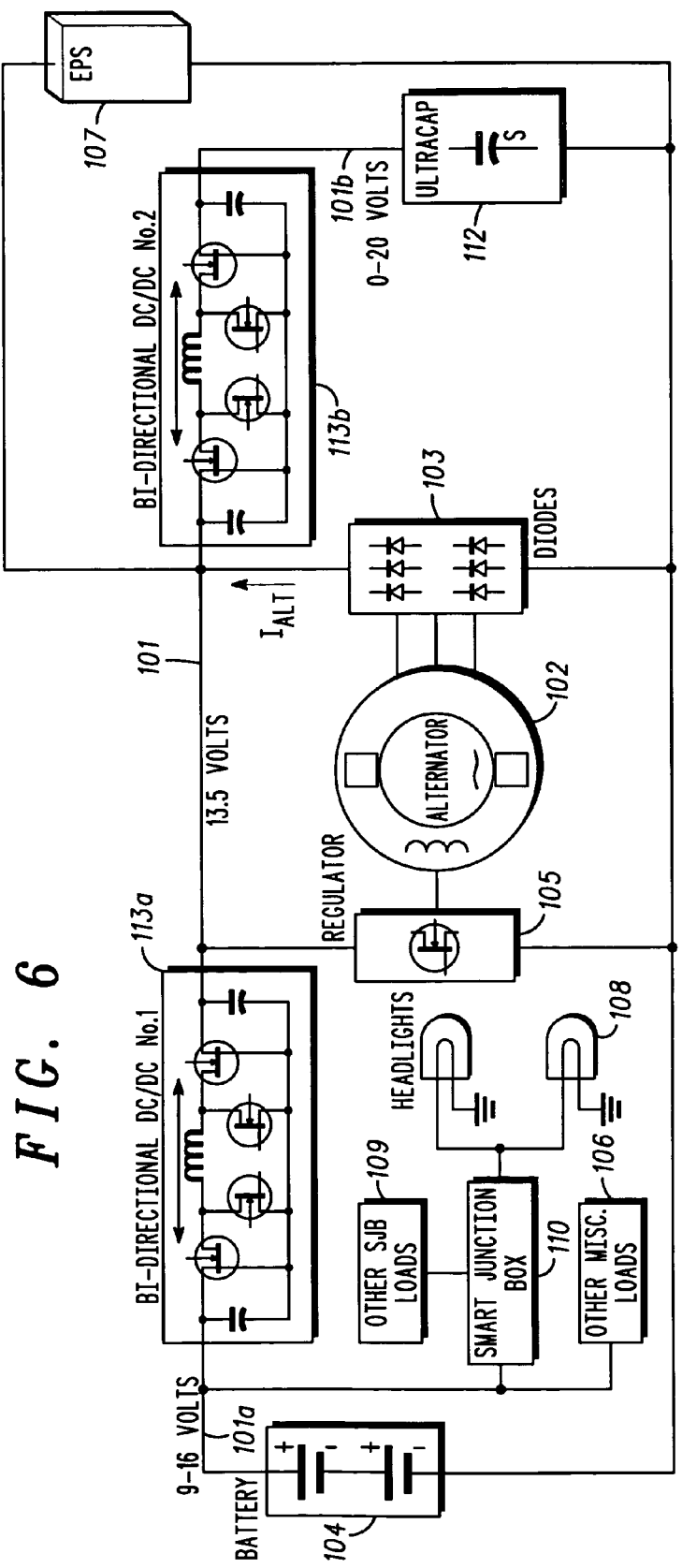
FIG. 6 illustrates another variation of the circuit of FIG. 3 in which the position of the high current transient load and the other electrical loads have been interchanged.

FIG. 6 illustrates another variation of the topology illustrated in FIG. 3. The topology of FIG. 6 differs from FIG. 3 in that the high transient current load, i.e., EPS 107, and the remainder of the circuit have been swapped. Thus miscellaneous loads 106, headlights 108 and other critical loads 109, along with battery 104, are connected to secondary bus 101a. As in the other cases, headlights 108 and other critical loads 109 are connected to secondary bus 101a by smart junction box 110. Alternator 102 powers main bus 101, to which EPS 107 is connected.

The bidirectional DC-DC converters 113a and 113b are each controlled in the same manner described above in FIG. 3 by the battery charge algorithm 120 and the alternator and supercapacitorm 122. When the EPS experiences a high current transient, it is disconnected from the battery via the bidirectional DC-DC converter 113a. During this high current transient, supercapacitor 112 provides excess current to EPS 107 through bidirectional DC-DC converter 113b. During normal operation, bidirectional DC-DC converter 113b is operative to charge supercapacitor 112 from main bus 101, and bidirectional DC-DC converter 113a operates to energize secondary bus 101a which charges battery 104 and powers headlights 108, critical loads 109, and miscellaneous loads 106.

Figure 7:
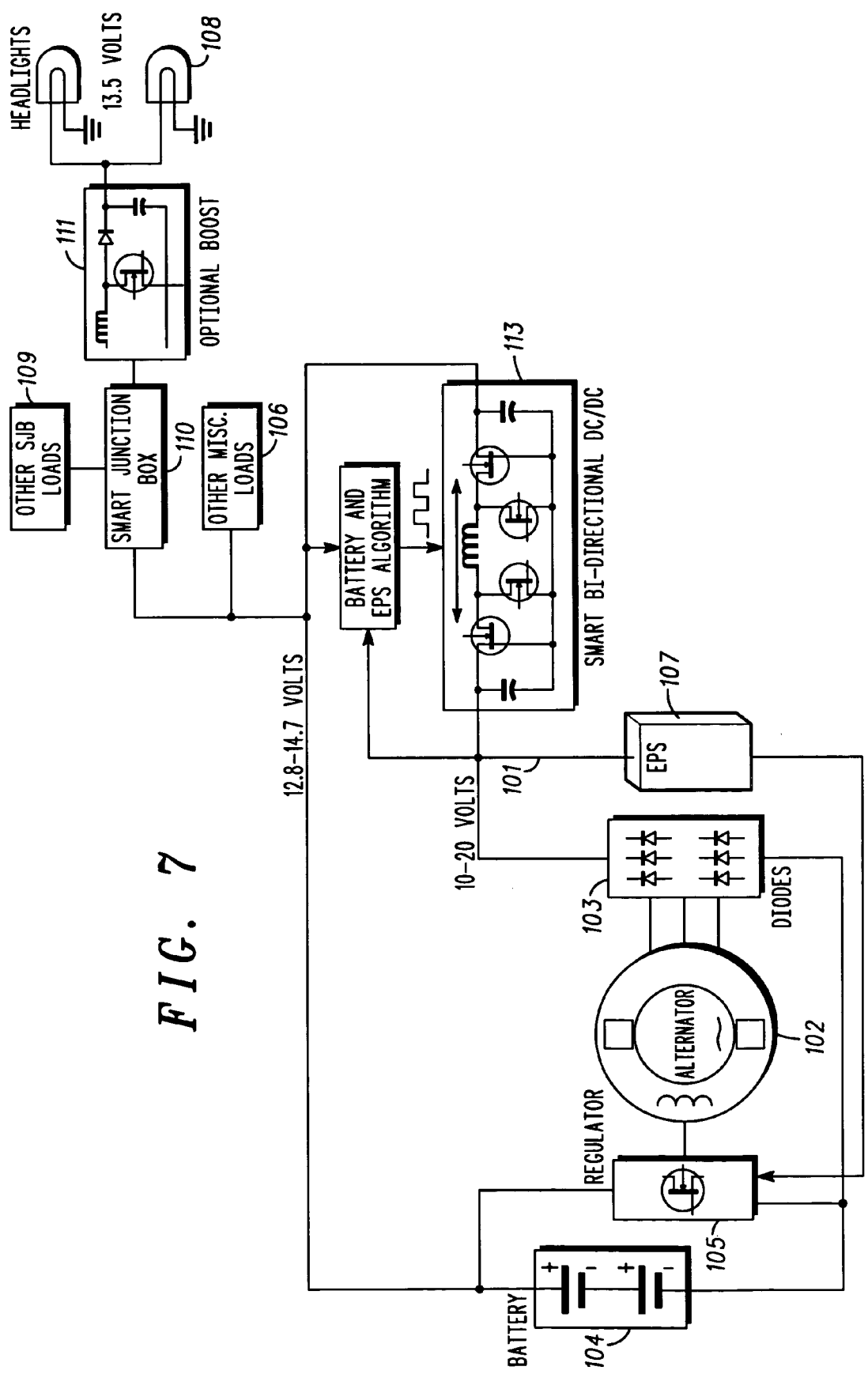
FIG. 7 illustrates an automotive electrical system in which a high current transient load is isolated from the remaining electrical loads.
Figure 8:
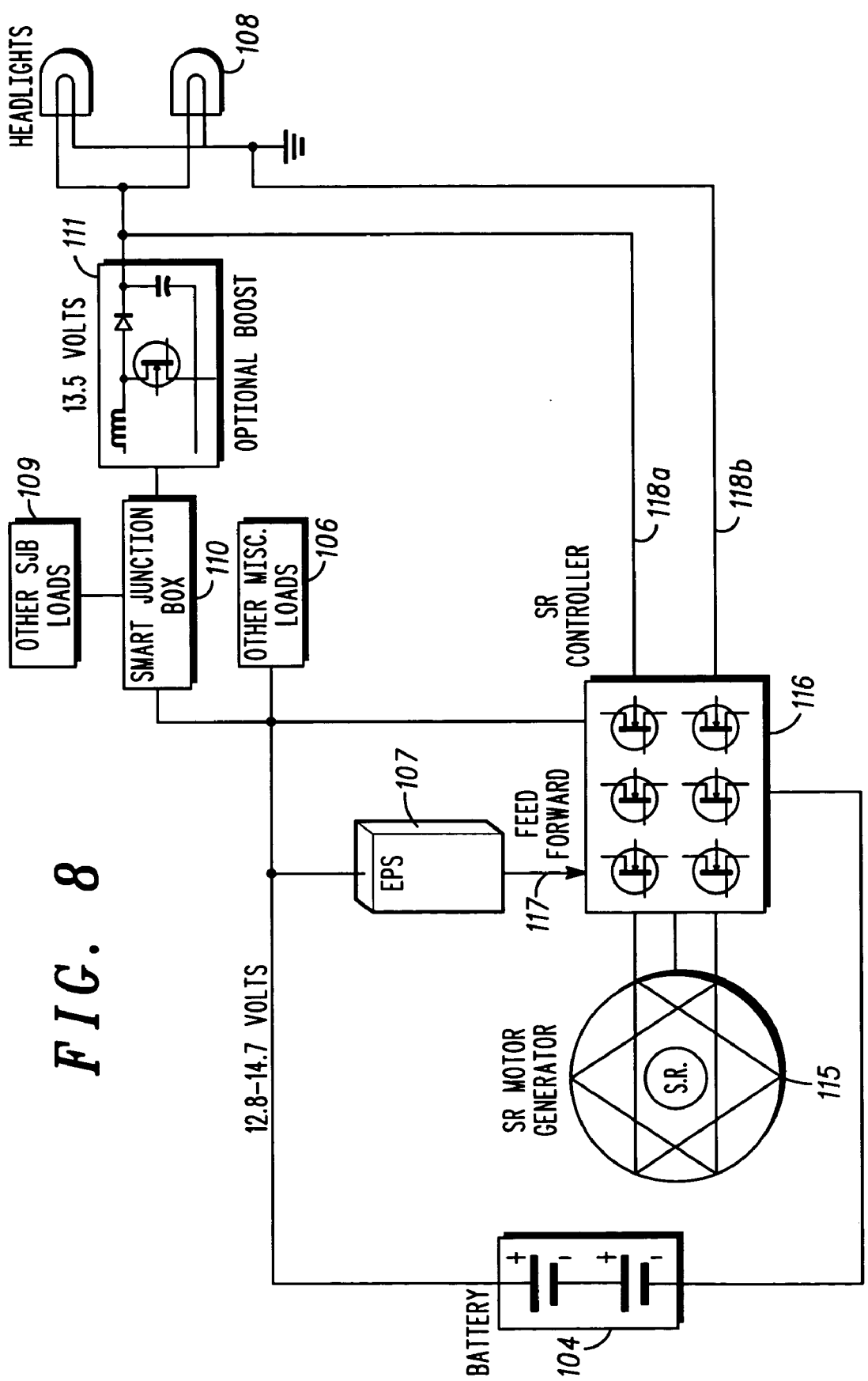
FIG. 8 illustrates still another automotive electrical system in which a conventional wound field alternator is replaced with a switched reluctance generator.

Still another automotive electrical system topology for providing a stable bus voltage to critical loads in the presence of high current loads is illustrated in FIG. 7. In this arrangement, EPS 117 and alternator 102 are isolated from the remainder of the system. The circuit depicted in FIG. 7 is essentially an amalgamation of the circuit of FIG. 1 with the circuits of FIGS. 3–6. As with the circuit of FIG. 1, headlights 108 are powered by a boost converter 111, although depending on the parameters of the rest of the system (time constants, etc.), boost converter 111 may not be required. The voltage on main bus 101 is controlled by bidirectional DC-DC converter 113, similar to the embodiments disclosed in FIGS. 3–6.

The high current load, EPS 107, is connected across the alternator, and, more specifically, across rectifier bank 103. Bidirectional DC-DC converter 113 isolates EPS 107 from the remainder of the system. Thus, during a large EPS current transient, the voltage across the alternator drops and, as a result, EPS 107 is disconnected from the remainder of the circuit. Consequently, the voltage drop across the battery is managed with priority given to regulating the system voltage.

One advantage of the topology illustrated in FIG. 7 is that EPS 107 need not be designed for a 13.2 volt system bus for all operating points. It is advantageous to increase the voltage to the EPS under high load (i.e., high EPS motor speed) conditions. To optimize this embodiment, EPS 107 needs to communicate to the alternator 102 when the load will increase or decrease to minimize the magnitude of alternator voltage swings due to increased EPS load. This takes the form of a typical feed-forward control circuit illustrated schematically by connection 117 in FIG. 7. This arrangement provides a major improvement in voltage regulation. This arrangement also provides the advantage of eliminating the supercapacitor or other energy storage device.

As mentioned above, in FIG. 7, the bidirectional DC-DC converter 113 acts as an isolator to disconnect EPS 107 from the remainder of the system if the EPS 107 current cannot be supplied by the alternator/battery combination while keeping the battery voltage within the desired range. In this way, EPS 107 cannot cause the secondary bus 101a voltage to vary outside the desired range, say 12.8V to 14.1V. This change in the secondary bus 101a voltage must occur slowly enough that the change in light brightness of the headlights 108 is not perceivable to the driver. This circuit differs from that of FIG. 6 in that the supercapacitor is removed, thereby forcing a greater variation in voltage onto the bus 101.

The EPS voltage will undergo large magnitude changes if disconnected from the battery 104 because there is no energy souce/sink to provide short term storage, indicated in FIG. 7 as bus 101. A range of 10–20V is indicated in FIG. 7 but this is only a representative range, and actual circuit values will depend on design constraints in the bidirectional DC-DC converter 1113, the alternator 102 and the EPS 107. In most circuit topologies, this energy storage is provided by a battery or supercapacitor. In cases where large power is needed by EPS 107, this is advantageous because the alternator output voltage may be increased well above the battery voltage, thereby decreasing alternator current and EPS current. During this time, current is supplied to the battery and load circuits by the bidirectional converter so the battery is not discharged.

To reduce the voltage swings on the output of the alternator 102, a feedforward signal 117 is used between the EPS 107 and the voltage regulator 105. The field voltage may be regulated according to relation (4):

$$V_f = K_P \cdot (13.5 - V_{alt}) + K_I \int (13.5 - V_{alt}) + K_{FF} \cdot I_{eps} \qquad (4)$$

where $V_f$ is the field voltage, $K_P$ and $K_I$ are the proportional and integral gains of a well-known PI (proportional-integral) controller, $V_{alt}$ is the alternator voltage, $K_{FF}$ is the feed forward gain and $I_{eps}$ is the EPS current. Selection of an appropriate feed forward gain for the battery current will lead to an increase or decrease in field voltage before the output voltage changes. Design techniques for these controllers are generally known to those skilled in the art, and may also be found in "Computer Controlled Systems: Theory and Design", by Astrom/Wittenmark, 1990, pp. 150–151 (which is incorporated by reference). The feedforward gain, $K_{ff}$, may be varied as a function of field current if the alternator rotor is in saturation. When the rotor is in saturation, an increase in field current results in a smaller increase in back emf and a correspondingly smaller increase in battery charging current, i.e., diminishing returns. The saturation phenomenon is explained in "Electric Machinery", by Fitzgerald et. al., 1983, p. 176–178, which is incorporated by reference. When the machine is saturated, a plot of field current versus open circuit voltage shows a deviation from a straight line. As the field current increases and saturation begins, the constant slope reduces as the output voltage increase in less than the field current increase. Ideally, $K_{ff}$ is modified so that the product of $K_{ff}$ and the inverse of the open circuit curve slope is a constant. In effect, $K_{ff}$ increases at the onset of saturation and continues to increase as the amount of saturation increases.

A final embodiment is illustrated in FIG. 8. This embodiment features a generator with a faster response time to eliminate the need for isolating EPS 107 from the remainder of the system. This circuit is topologically similar to the circuit of FIG. 1, except the traditional alternator 102 and rectifier bridge 103 have been replaced by a switched reluctance generator 115 and switch reluctance controller 116. Switched reluctance generators and their controllers are known to those skilled in the art, and thus details of their construction and configuration are not repeated here. A switched reluctance generator is preferable to a conventional wound field alternator because of the enhanced transient response of the switched reluctance machine. The response of a typical Lundell wound field alternator is characterized by a time constant of about 0.2 seconds, which is a result of the relatively large inductance of the field winding. In contrast, a switched reluctance generator has a time constant on the order of 25 milliseconds.

Also included in FIG. 8 is a boost converter 111 for headlights 108, although in a well-designed system boost converter 111 would not be required because of the enhanced transient response of switched reluctance generator over conventional wound field alternators. It is also noted that the circuit disclosed in FIG. 8 includes feed forward control from EPS 107 to switched reluctance generator controller 116, which further helps to enhance the response time of the system to EPS high current transients. Furthermore, a switched reluctance machine may also be advantageously employed with any of the automobile electrical system topologies disclosed herein.

A further enhancement of FIG. 8 includes a voltage sense winding connected across the critical loads that is used as the voltage feedback signal for the switched reluctance generator controller. The sensed voltage can be either the supplied voltage as shown in feedback loop 118a or both the positive sensed voltage 118a and the return voltage as shown in feedback loop 118b. This is a practical control method because of the reduced response time of the switched reluctance generator as compared to the response of the wound field machine. This addition improves the voltage regulation across the critical loads because the voltage drop due to the bus interconnect resistance and inductance is bypassed. In contrast, today's wound field machine uses the rectifier 103 output as the feedback reference point. The optimal feedback situation is to feedback both the positive and ground return voltage across the load, i.e., both feedback loops 118a and 118b, to mitigate the effect of the positive and negative bus leads.

In FIG. 8, the faster time constant of the switch reluctance generator 115 eliminates the need for a supercapacitor to provide a short term current supply. However, a feedforward signal 117 from the EPS 107 may still be used here to reduce the transient voltage change when a large EPS current is drawn. The switch reluctance control algorithm may be written according to relation (5):

$$V_{control} = K_P \cdot (13.5 - V_{alt}) + K_I \int (13.5 - V_{alt}) + K_{FF} \cdot I_{eps} \qquad (5)$$

The operation of the switch reluctance generator is described in "Brushless PM and Reluctance Motor Drives", by T. J. E. Miller, published by Clarendon Press, Oxford, 1989. As described in this text, the ideal current waveform is a square wave and the role of $V_{control}$ is to modulate the level of this current to vary the amount of current available at the output of the converter.

It should be understood that the inventive concepts disclosed herein are capable of many modifications, combinations and subcombinations. For example, the boost converter described with reference to FIG. 1 may advantageously be combined with other embodiments. Similarly, the feed forward control circuit of FIG. 8 may also be advantageously combined with other embodiments. Still further combinations are also possible. To the extent such permutations fall within the scope of the appended claims and their equivalents, they are intended to be covered by this patents.

What is claimed is:

1. An automotive electrical system comprising:
   a main bus;
   a secondary bus;
   a multidirectional electronic power converter connecting the main bus and the secondary bus;
   an energy storage device connected to the secondary bus;
   an electrical energy generating device connected to the main bus;
   at least one critical load connected to one of the main bus and the secondary bus; and
   at least one high current load connected to one of the main bus and the secondary bus wherein the high current load is connected to the bus not connected to the critical load;
   wherein the multidirectional electronic power converter is configured to maintain a substantially constant voltage on the bus connected to the critical load in response to a voltage dip on the bus connected to the high current load due to a high current transient.

2. The automotive electrical system of claim 1 wherein the energy generating device is a switched reluctance generator and wherein the voltage regulator is a switched reluctance controller.

3. The automotive electrical system of claim 2 further comprising a feedback path connecting a voltage supplied to the critical load to a switched reluctance controller controlling the switched reluctance generator.

4. The automotive electrical system of claim 1 wherein the critical load is connected to the main bus and the high current load is connected to the secondary bus.

5. The automotive electrical system of claim 4 further comprising a smart junction box connected between the main bus and the critical load, wherein the smart junction box includes a microcontroller for controlling one or more loads connected thereto.

6. The automotive electrical system of claim 4 further comprising a supercapacitor coupled to the main bus by a second multidirectional electronic power converter configured to deliver energy to the main bus in response to the voltage dip caused by the high current transient.

7. The automotive electrical system of claim 4 wherein the multidirectional electronic power converter is a bidirectional DC-DC converter.

8. The automotive electrical system of claim 7 further comprising a supercapacitor coupled to the main bus by a second bidirectional DC-DC converter configured to deliver energy to the main bus in response to the voltage dip caused by the high current transient.

9. The automotive electrical system of claim 4 wherein the multidirectional electronic power converter is a tri-directional DC-DC converter having a first input connected to the main bus, a second input connected to the secondary bus, and a third input connected to a supercapacitor.

10. The automotive electrical system of claim 9 further comprising a current sensor configured to measure output current of the energy generating device and input the current into a control circuit of the tri-directional DC-DC converter.

11. The automotive electrical system of claim 9 wherein the tri-directional DC-DC converter is interconnected with a voltage regulator configured to control the output voltage of the energy generating device.

12. The automotive electrical system of claim 10 wherein the tri-directional DC-DC converter is interconnected with a voltage regulator configured to control the output voltage of the energy generating device.

13. The automotive electrical system of claim 1 wherein the critical load is connected to the secondary bus and the high current load is connected to the main bus.

14. The automotive electrical system of claim 13 further comprising a smart junction box connected between the secondary bus and the critical load, wherein the smart junction box includes a microcontroller for controlling one or more loads connected thereto.

15. The automotive electrical system of claim 13 further comprising a supercapacitor coupled to the main bus by a second multidirectional electronic power converter configured to deliver energy to the main bus in response to the voltage dip caused by the high current transient.

16. The automotive electrical system of claim 13 wherein the multidirectional electronic power converter is a bidirectional DC-DC converter.

17. The automotive electrical system of claim 16 further comprising a supercapacitor coupled to the main bus by a second bidirectional DC-DC converter configured to deliver energy to the main bus in response to the voltage dip caused by the high current transient.

18. The automotive electrical system of claim 1 wherein the high current load is interconnected with a voltage regulator configured to control the output voltage of the electrical energy generating device.

19. The automotive electrical system of claim 18 further comprising a boost converter coupled between the main bus and the critical load and configured to maintain sufficient input voltage to the critical load in response to a voltage dip on the main pus caused by the high current transient.

20. The automotive electrical system of claim 18 further comprising a smart junction box connected between the main bus and the critical load, wherein the smart junction box includes a microcontroller for controlling one or more loads connected thereto.

21. The automotive electrical system of claim 19 further comprising a smart junction box connected between the main bus and the critical load, wherein the smart junction box includes a microcontroller for controlling one or more loads connected thereto.

22. A method of providing electrical power in an automotive electrical system comprising:
   generating electrical energy;
   delivering the generated electrical energy to a first bus;
   connecting a second bus to the first bus using a multidirectional DC-DC converter;
   storing electrical energy in a battery connected the second bus;
   connecting at least one critical load to one of the first bus and the second bus; and
   connecting at least one high current load to one of the first bus and the second bus, wherein the high current load is connected to the bus not connected to the critical load;
   wherein the multidirectional DC-DC converter is configured to maintain a substantially constant voltage on the bus connected to the critical load in response to a voltage dip on the bus connected to the high current load due to a high current transient.

23. The method of claim 22 further comprising controlling the at least one critical load using a smart junction box.

24. The method of claim 22 further comprising providing a feedback path between the high current load and a voltage regulator for controlling the step of generating electrical energy.

25. The method of claim 22 further comprising:
   connecting at least one critical load to the main bus using an electronic boost converter, wherein the electronic boost converter is configured to increase voltage supplied to the critical load in response to a voltage dip on the main bus caused by a high current transient of the high current load.

26. An automotive electrical system comprising:
   a main bus;
   an energy storage device connected to the main bus;
   a bidirectional DC-DC converter having a first input connected to the main bus and a second input connected to an electrical energy generating device;
   at least one critical load connected to the main bus; and
   at least one high current load connected to the second input of the bidirectional DC-DC converter;
   wherein the bidirectional DC-DC converter is configured to maintain a substantially constant voltage on the main bus in response to a high current transient caused by the high current load and wherein the high current load is interconnected with a voltage regulator configured to control the output voltage of the electrical energy generating device.

27. The automotive electrical system of claim 26 further comprising a boost converter coupled between the main bus and the critical load and configured to maintain sufficient input voltage to the critical load in response to a voltage dip on the main bus caused by the high current transient.

28. The automotive electrical system of claim 26 further comprising a smart junction box connected between the main bus and the critical load, wherein the smart junction box includes a microcontroller for controlling one or more loads connected thereto.

29. The automotive electrical system of claim 27 further comprising a smart junction box connected between the main bus and the boost converter, wherein the smart junction box includes a microcontroller for controlling one or more loads connected thereto.

30. The automotive electrical system of claim 26 wherein the electrical energy generating device is a switched reluctance generator and wherein the voltage regulator is a switched reluctance controller.

31. The automotive electrical system of claim 30 further comprising a feedback path connecting a voltage supplied to the critical load to a switched reluctance controller controlling the switched reluctance generator.

32. The automotive electrical system of claim 27 wherein the electrical energy generating device is a switched reluctance generator and wherein the voltage regulator is a switched reluctance controller.

33. The automotive electrical system of claim 32 further comprising a feedback path connecting a voltage supplied to the critical load to a switched reluctance controller controlling the switched reluctance generator.

34. The automotive electrical system of claim 28 wherein the electrical energy generating device is a switched reluctance generator.

35. The automotive electrical system of claim 34 further comprising a feedback path connecting a voltage supplied to the critical load to a switched reluctance controller controlling the switched reluctance generator.

* * * * *